US012667011B2

(12) United States Patent
Yamaoka et al.

(10) Patent No.: US 12,667,011 B2
(45) Date of Patent: Jun. 23, 2026

(54) ADVANCED LIFT METHOD AND APPARATUS FOR TRANSFERRING OPTICAL DEVICES USING LASER EMISSION AND PHOTOMASK TECHNIQUES

(71) Applicant: Shin-Etsu Chemical Co., Ltd., Tokyo (JP)

(72) Inventors: Hiroshi Yamaoka, Yokohama (JP); Nobutaka Uemori, Kashiwa (JP); Satoki Nakada, Yokohama (JP); Takeshi Saito, Yokohama (JP); Shusaku Ozawa, Funabashi (JP); Shinichi Sato, Sakura (JP); Masami Kurata, Nerima-ku (JP); Masahiko Sato, Edogawa-ku (JP); Tsukasa Abe, Meguro-ku (JP); Tsuyoshi Noguchi, Adachi-ku (JP); Taketo Usami, Shinagawa-ku (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 455 days.

(21) Appl. No.: 18/027,807

(22) PCT Filed: Sep. 29, 2021

(86) PCT No.: PCT/JP2021/035794
§ 371 (c)(1),
(2) Date: Mar. 22, 2023

(87) PCT Pub. No.: WO2022/071371
PCT Pub. Date: Apr. 7, 2022

(65) Prior Publication Data
US 2024/0014200 A1     Jan. 11, 2024

(30) Foreign Application Priority Data

Sep. 30, 2020     (JP) ................................. 2020-165877

(51) Int. Cl.
*H10W 90/00*     (2026.01)
*H10H 29/14*     (2025.01)

(52) U.S. Cl.
CPC .......... *H10W 90/00* (2026.01); *H10H 29/142* (2025.01)

(58) Field of Classification Search
CPC . H01L 25/50; H01L 21/681; H01L 21/67144; H01L 24/97; H01L 25/0753;
(Continued)

(56) References Cited

U.S. PATENT DOCUMENTS 10,921,722 B2 *     2/2021     Takakuwa ............. G03F 9/7084
2002/0043923 A1     4/2002     Natori
(Continued)

FOREIGN PATENT DOCUMENTS

CN     109791959 A     5/2019
CN     111128843 A     5/2020
(Continued)

OTHER PUBLICATIONS

International Preliminary Report on Patentability issued in corresponding International Patent Application No. PCT/JP2021/035794 dated Apr. 131, 2023.
(Continued)

*Primary Examiner* — Thanh Y. Tran
(74) *Attorney, Agent, or Firm* — Morgan, Lewis & Bockius LLP

(57) ABSTRACT

The present invention provides a method of relocating optical devices onto a carrier substrate in a case where a pixel pitch of a display is not an integer multiple of a pitch of the optical devices arrayed on a sapphire substrate. A moving speed ratio between a donor substrate and a receptor substrate is determined from an array pitch (3, 4) of optical devices (2) formed on the sapphire substrate and an array
(Continued)

pitch (5, 7) of optical devices to be transferred onto a carrier substrate (6), and the optical devices are subjected to LIFT (laser transferred) in synchronization with movement of the donor substrate, whereby the optical devices on the sapphire substrate are transferred onto the carrier substrate at an array pitch that is identical to the pixel pitch of the display.

43 Claims, 5 Drawing Sheets

(58) Field of Classification Search
     CPC .......... H01L 2224/75263; H01L 2224/75801;
                   H10H 20/018; H10F 30/21; H10F 71/127;
                                                H10F 71/139
     See application file for complete search history.

(56) References Cited

U.S. PATENT DOCUMENTS

| | | | |
|---|---|---|---|
| 2002/0064032 A1 | 5/2002 | Oohata |
| 2005/0227455 A1 | 10/2005 | Park et al. |
| 2008/0108171 A1 | 5/2008 | Rogers et al. |
| 2014/0308768 A1 | 10/2014 | Myoung et al. |
| 2016/0225953 A1 | 8/2016 | Meitl et al. |
| 2019/0221466 A1 | 7/2019 | Arai |
| 2020/0194616 A1 | 6/2020 | Henley |
| 2020/0203557 A1 | 6/2020 | Park et al. |
| 2020/0243708 A1 | 7/2020 | Yanagawa et al. |
| 2021/0225679 A1 | 7/2021 | Luan et al. |
| 2022/0124949 A1 | 4/2022 | Nakagawa et al. |
| 2024/0014200 A1 | 1/2024 | Yamaoka et al. |

FOREIGN PATENT DOCUMENTS

| | | |
|---|---|---|
| CN | 216980602 A | 7/2022 |
| CN | 219371054 U | 7/2023 |
| JP | 2002-062825 A | 2/2002 |
| JP | 2002-118124 A | 4/2002 |
| JP | 2002-158237 A | 5/2002 |
| JP | 2007-534164 A | 11/2007 |
| JP | 2013-247372 A | 12/2013 |
| JP | 2014-225588 A | 12/2014 |
| JP | 2018-506850 A | 3/2018 |
| JP | 2018-060993 A | 4/2018 |
| JP | 2018-163900 A | 10/2018 |
| JP | 2019-067892 A | 4/2019 |
| JP | 2020-004478 A | 1/2020 |
| JP | 2020-129638 A | 8/2020 |
| KR | 10-2013-0118616 A | 10/2013 |
| KR | 10-2014-0124454 A | 10/2014 |
| KR | 10-2020-0070291 A | 6/2020 |
| TW | 201826568 A | 7/2018 |
| TW | 201921729 A | 6/2019 |
| WO | 2020/186456 A1 | 9/2020 |

OTHER PUBLICATIONS

Office Action issued in corresponding Japanese Patent Application No. 2021-156889, dated Apr. 8, 2025.

Office Action issued in corresponding Japanese Patent Application No. 2021-156889, dated Jun. 24, 2025.

Office Action issued in corresponding Korean Patent Application No. 10-2023-7009310, dated May 16, 2025.

Office Action and Search Report (with partial translation) dated Oct. 8, 2024, issued in corresponding Taiwanese Patent Application No. 110135861.

International Search Report issued in corresponding International Patent Application No. PCT/JP2021/035794 dated Nov. 9, 2021.

Extended European Search Report issued in corresponding European Patent Application No. 21875671.6, dated Jan. 8, 2025.

Office Action and Search Report issued in corresponding Chinese Patent Application No. 202180065158.5, dated Aug. 1, 2025.

Decision of Refusal issued in corresponding Taiwanese Patent Application No. 110135861, dated Jun. 26, 2025, with a partial English translation.

Office Action issued in corresponding Vietnamese Patent Application No. 1-2023-01992, dated Aug. 16, 2025.

Decision of Refusal issued in corresponding Japanese Patent Application No. 2021-156889, dated Nov. 11, 2025, with a partial English translation.

Decision to Dismiss the Amendment issued in corresponding Japanese Patent Application No. 2021-156889, dated Nov. 11, 2025, with a partial English translation.

Office Action and Search Report issued in corresponding Taiwanese Patent Application No. 110135861, dated Jan. 12, 2026 with partial English translations.

Search Report issued in corresponding Chinese Patent Application No. 202180065158.5, dated Mar. 26, 2026.

Office Action issued in corresponding Korean Patent Application No. 10-2023-7009310, dated Feb. 23, 2026 with a partial English translation.

* cited by examiner

[FIG. 1]
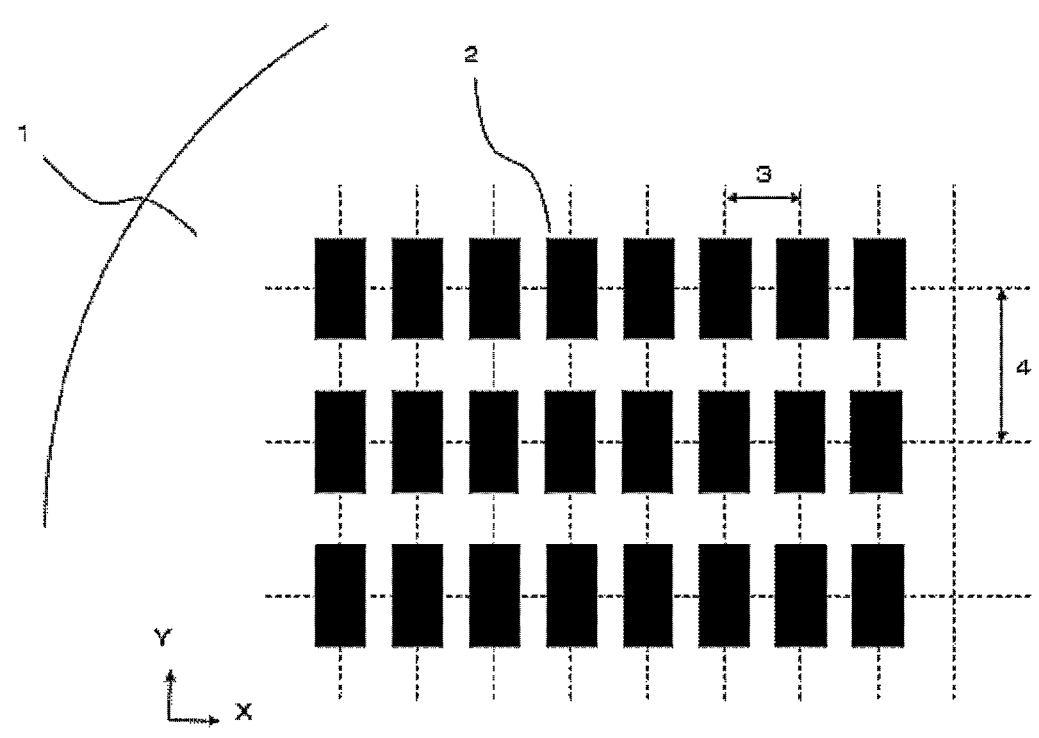
[FIG. 2]
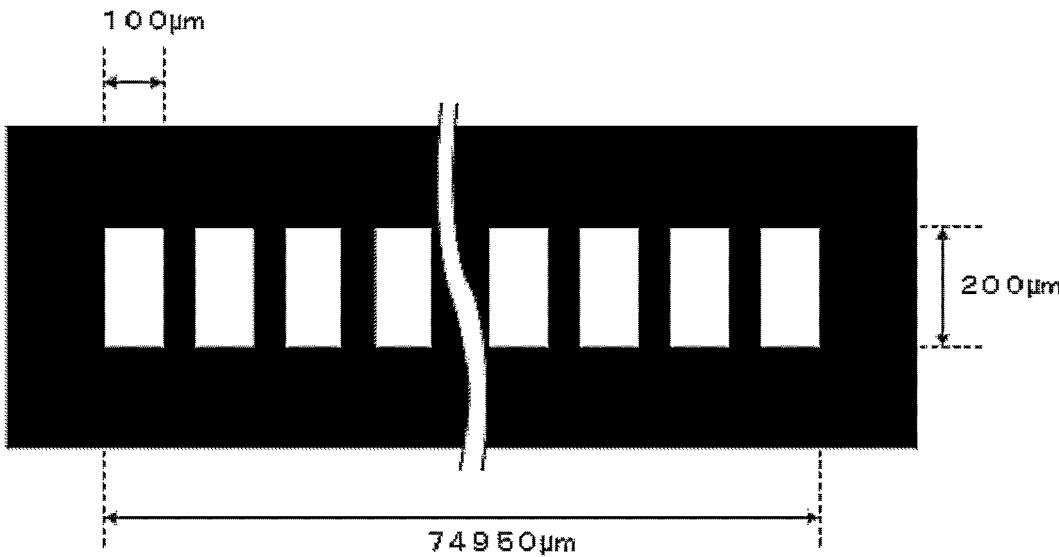

[FIG. 3]
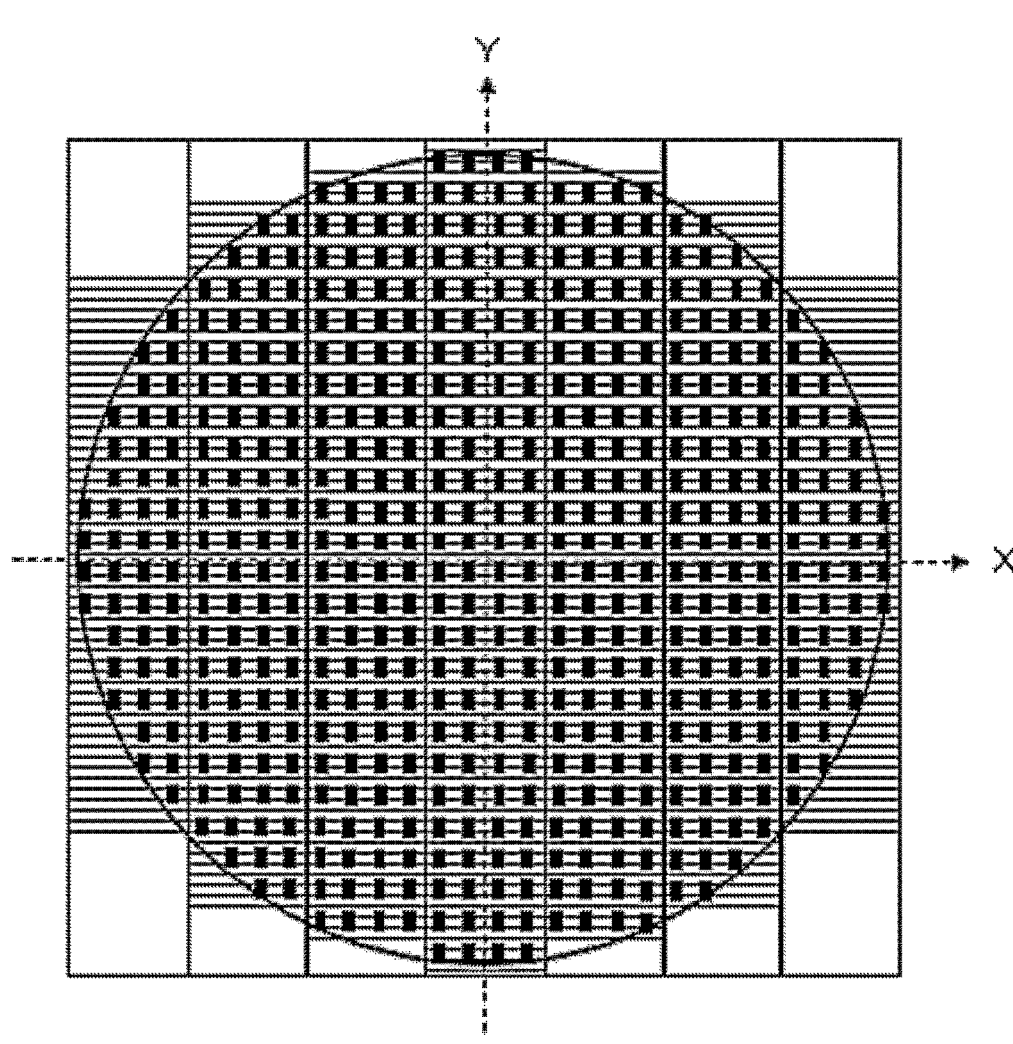

[FIG. 4]
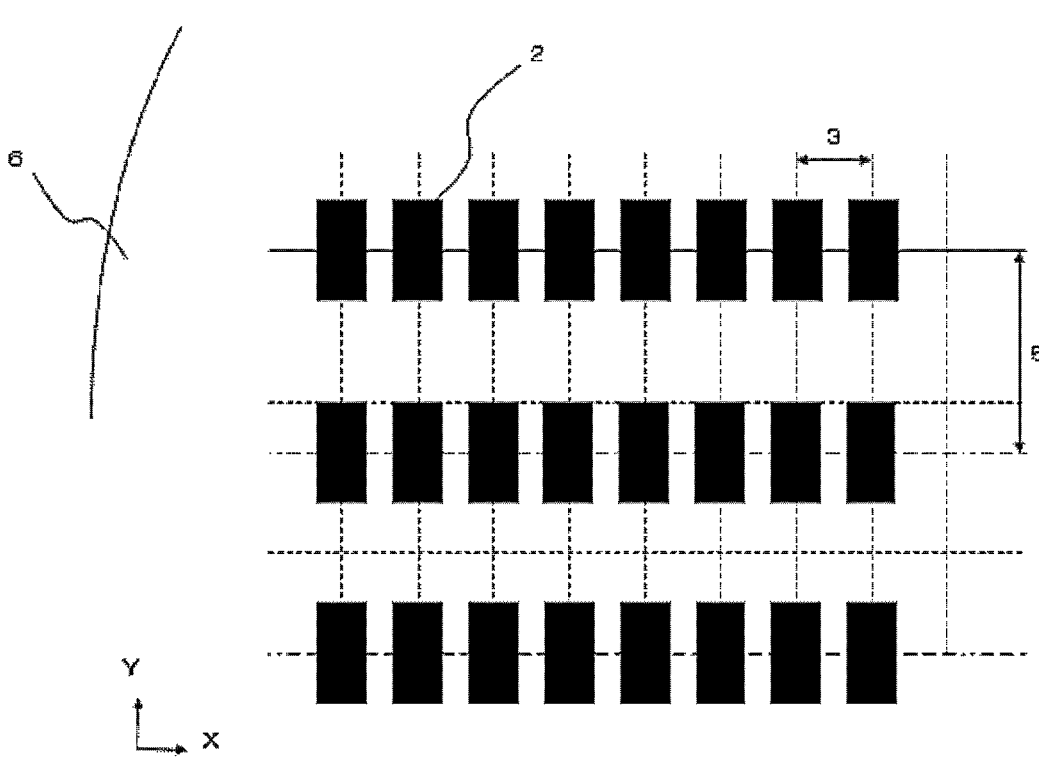

[FIG. 5]
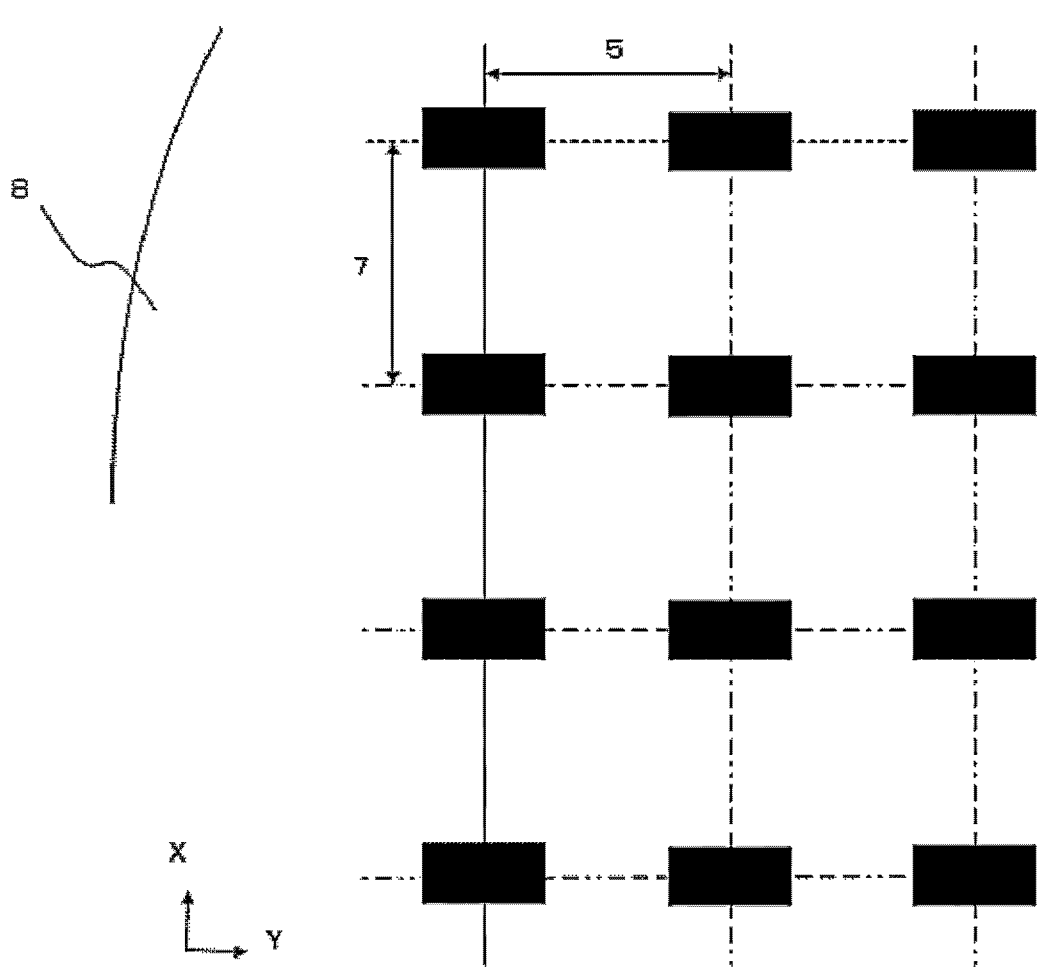

[FIG. 6]
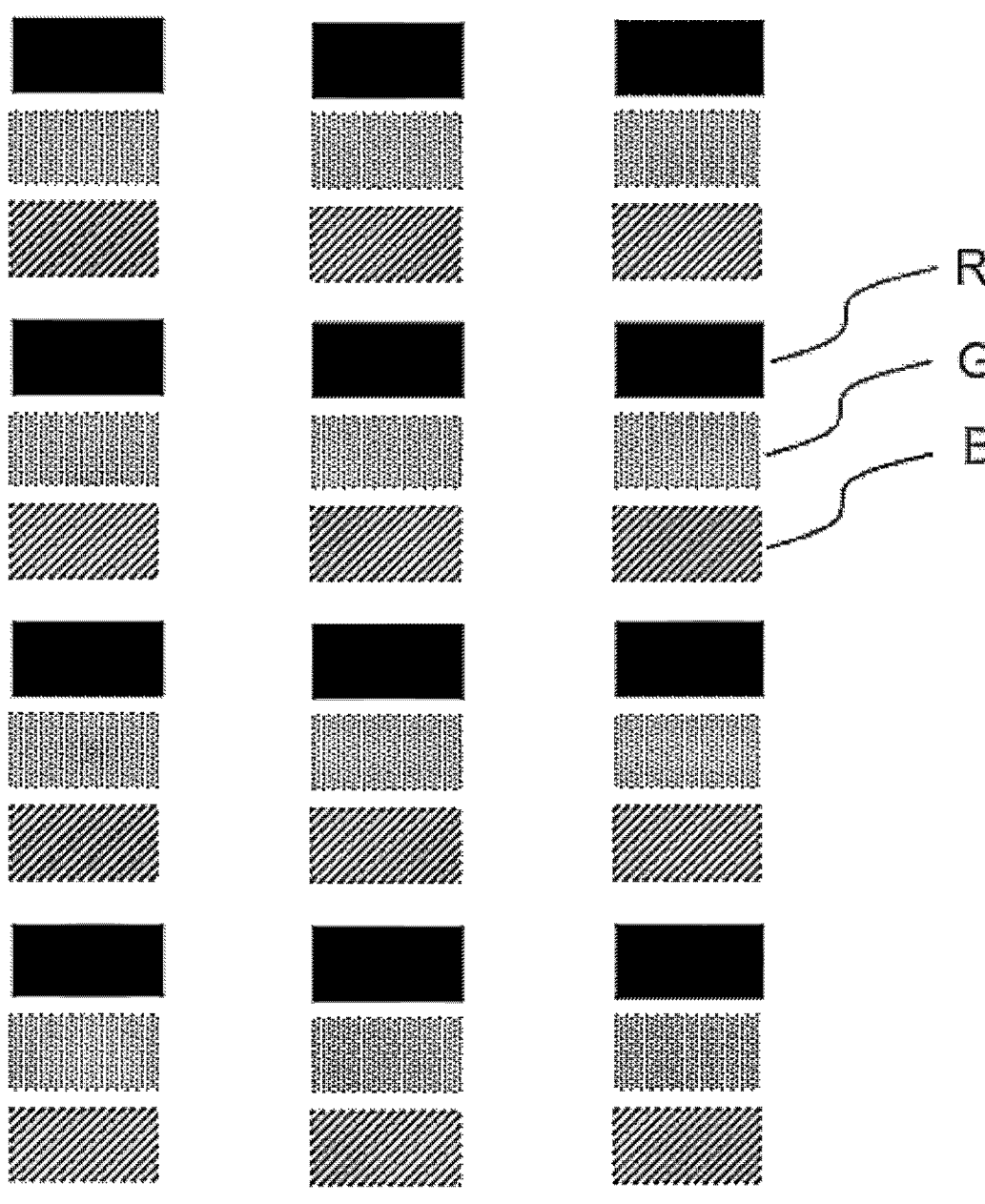

ADVANCED LIFT METHOD AND APPARATUS FOR TRANSFERRING OPTICAL DEVICES USING LASER EMISSION AND PHOTOMASK TECHNIQUES

TECHNICAL FIELD

The present invention relates to a process of mounting micro LEDs.

BACKGROUND ART

In recent years, nitride semiconductor optical devices have been increasingly used for a backlight of a liquid crystal display and a display for signage. Since a large amount of optical devices are used at a time for these applications, a high-speed transfer technique has been demanded. As the high-speed transfer technique, collective relocation using a stamp method is generally performed, and transfer of one thousand to several tens of thousands of optical devices at once has become possible.

A large amount of optical devices are produced on a sapphire substrate by a semiconductor process. The number of light emitting diodes (LEDs) of a 100 μm or less square called micro LEDs produced on a 4-inch substrate is millions. A micro LED, which is micro device with a length of several tens of micro-meters, is utilized after being separated from the sapphire substrate, which is an epitaxial substrate. Generally, a support substrate is bonded to the optical devices arrayed on the sapphire substrate, and the optical devices are separated from the sapphire substrate by laser lift-off.

The support substrate or a substrate onto which the optical devices are transferred from the support substrate is used as a carrier substrate, and the optical devices are picked up from the carrier substrate at an interval corresponding to a pixel pitch of a display with use of special stamping and are mounted on a backplane substrate. Hence, a pitch of the optical devices on the sapphire substrate needs to be one-N-th the pixel pitch of the display, where N is a positive integer.

Patent Literature 1 describes laser lift-off from a sapphire substrate made of a nitride semiconductor. Patent Literature 2 and Patent Literature 3 propose high-speed mounting using stamping of different methods. Patent Literature 4 describes a LIFT apparatus that performs a LIFT from a donor substrate onto a receptor substrate.

CITATION LIST

Patent Literature

Patent Document 1: JP 2007-534164 A
Patent Document 2: JP 2020-129638 A
Patent Document 3: JP 2018-163900 A
Patent Document 4: JP 2020-004478 A

SUMMARY OF INVENTION

Technical Problem

However, the pixel pitch of the display is varied depending on a size of the display and a resolution such as 4K and 8K, and providing the pitch of the optical devices on the sapphire substrate corresponding to the pixel pitch prevents mass production of optical devices and leads to cost increase. This is an issue in common with a panel-type device using a laser diode or a photodiode device.

The present invention relates to a method of solving an issue in a case where the pixel pitch of the display or the like does not satisfy a positive integer multiple of the pitch of the optical devices, which is a point at the above-mentioned issue.

Solution to Problem

A first aspect of the present invention relates to a laser induced forward transfer (LIFT) method of performing LIFT of optical devices on a sapphire substrate serving as a donor substrate onto a carrier substrate serving as a receptor substrate, the method comprising steps of:

acquiring a reference position D and an array pitch D of array of the optical devices formed on the sapphire substrate;

acquiring a reference position R and an array pitch R of array of the optical devices to be transferred onto the carrier substrate by LIFT;

based on the reference position D and the reference position R, causing the sapphire substrate and the carrier substrate to face each other and adjusting either or both of a position of the sapphire substrate and a position of the carrier substrate so that a distance from a surface of each of the optical devices to the carrier substrate becomes a predetermined value;

calculating a scan speed ratio VR between the sapphire substrate and the carrier substrate from the array pitch D and the array pitch R;

emitting laser light toward a plurality of the optical devices aligned in a row on a boundary surface between the sapphire substrate and the optical devices from a back surface side of the sapphire substrate;

aligning relative positions of the sapphire substrate and the carrier substrate within a horizontal plane based on the reference position D and the reference position R, and performing a scan operation on the sapphire substrate and the carrier substrate in the speed ratio VR; and emitting laser light in conjunction with the scan operation to perform LIFT. The "optical devices" mentioned herein include laser diodes and photodiodes as long as each of the above-mentioned steps can be utilized.

A second aspect relates to the LIFT method according to the first aspect, wherein the array pitch D includes an array pitch DX in an X-direction and an array pitch DY in a Y-direction, wherein the array pitch R includes an array pitch RX in the X-direction and an array pitch RY in the Y-direction, and wherein the speed ratio VR includes a speed ratio VRX in the X-direction and a speed ratio VRY in the Y-direction, the speed ratio VRX being calculated from the array pitches DX and RX and the speed ratio VRY being calculated from the array pitches DY and RY, the method further comprising:

a step in which, after LIFT in the speed ratio VRY, the carrier substrate is rotated by 90 degrees within the horizontal plane in a scan direction to be mounted as the donor substrate, instead of the sapphire substrate, and the LIFT onto a second carrier substrate is performed in the speed ratio VRX.

A third aspect relates to the LIFT method according to the second aspect, wherein emission of the laser light is reduced projection using a photomask, the photomask has a first opening and a second opening, the first opening corresponding to approximately one optical device in the Y-direction and two or more optical devices at the array pitch DX in the X-direction, and the second opening corresponding to approximately one optical device in the X-direction and two or more optical devices at the array pitch RY in the Y-direction, the method further comprising a step of switching a mask so as to use the first opening in a case of LIFT in the speed ratio VRY and use the second opening in a case of LIFT in the speed ratio VRX.

A fourth aspect relates to the LIFT method according to the third aspect, wherein openings in the photomask constitute an opening group that is irradiated to each of the optical devices in a shape substantially corresponding to the optical device.

A fifth aspect relates to a LIFT apparatus for performing LIFT optical devices on a sapphire substrate serving as a donor substrate onto a carrier substrate serving as a receptor substrate, the LIFT apparatus comprising:

a first processing unit configured to acquire a reference position D and an array pitch D of array of the optical devices formed on the sapphire substrate;

a second processing unit configured to acquire a reference position R and an array pitch R of array of the optical devices to be transferred onto the carrier substrate by LIFT;

a stage and a stage controller that are configured to, based on the reference position D and the reference position R, cause the sapphire substrate and the carrier substrate to face each other and adjust either or both of a position of the sapphire substrate and a position of the carrier substrate so that a distance from a surface of each of the optical devices to the carrier substrate becomes a predetermined value;

a third processing unit configured to calculate a scan speed ratio VR between the sapphire substrate and the carrier substrate from the array pitch D and the array pitch R;

a reduced projection optical system configured to emit laser light toward a plurality of the optical devices aligned in a row on a boundary surface between the sapphire substrate and the optical devices from a back surface side of the sapphire substrate;

a stage and a stage controller that are configured to align relative positions of the sapphire substrate and carrier substrate within a horizontal plane based on the reference position D and the reference position R, and perform a scan operation on the sapphire substrate and the carrier substrate in the speed ratio VR; and a laser apparatus configured to emit laser light in conjunction with the scan operation.

A sixth aspect relates to a LIFT method of performing LIFT of micro devices on a sapphire substrate serving as a donor substrate onto a receptor substrate including an adhesive layer, the method comprising steps of:

acquiring three-dimensional sizes of micro devices arrayed on the donor substrate, and a reference position D and an array pitch D of the array;

acquiring a reference position R and an array pitch R of array of the micro devices to be mounted onto the receptor substrate by LIFT;

based on the reference position D and the reference position R, causing the donor substrate and the receptor substrate to face each other, measuring an interval between the donor substrate and the receptor substrate, and adjusting either or both of a position of the donor substrate and a position of the receptor substrate so that a distance from a lower surface of each of the micro devices to the receptor substrate becomes a predetermined value; and aligning relative positions of the donor substrate and receptor substrate within a horizontal plane, and performing reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 J/cm$^2$, a density of an atmosphere filling the interval between the donor substrate and the receptor substrate is 1 to 2 kg/m$^3$, the adhesive layer has a hardness of 20 to 50 (JIS, Type A) and a thickness of 5 μm or more, and the predetermined value is 10 to 200 μm.

Advantageous Effects of Invention

This brings about an advantageous effect that it is possible to perform high-speed mounting using the stamp method even in a case where the pixel pitch of the display does not satisfy the integer multiple of the pitch of the optical devices.

BRIEF DESCRIPTION OF DRAWINGS

FIG. 1 is an illustration showing array of micro LEDs on a sapphire substrate serving as a donor substrate.

FIG. 2 shows an example of a photomask pattern.

FIG. 3 shows an example of irradiation of a 4-inch φ sapphire substrate with laser.

FIG. 4 is an illustration showing array of micro LEDs after LIFT in a Y-direction.

FIG. 5 is an illustration showing array of micro LEDs before and after LIFT in an X-direction.

FIG. 6 is an illustration showing a second carrier substrate on which RGB are mounted.

DESCRIPTION OF EMBODIMENTS

Embodiments of the present invention will be described below, but the present invention is not limited to the following embodiments. Note that in all drawings described below, dimensions and ratios of components are differentiated from actual dimensions and ratios to make the components more recognizable on the drawings.

In the present embodiment, a description will be given assuming that an optical device is a gallium nitride (GaN)-based semiconductor LED (light emitting diode). An LED manufacturer forms multitudes of LEDs on a sapphire substrate. In a case of a micro LED with a length of 100 μm or less, the LED manufacturer supplies the sapphire substrate as it is, or a carrier substrate onto which the micro LEDs have been transferred by laser lift-off to a manufacturer of a display using LEDs (hereinafter referred to as an LED display manufacturer).

The description herein is given of processing performed from the sapphire substrate.

In a case of a 4-inch sapphire substrate, several millions of micro LEDs are formed on the substrate. FIG. 1 is an illustration showing array of micro LEDs 2 formed on a sapphire substrate 1. A size of each LED is 20×40 μm (X×Y), and an array pitch 3 in an X-direction is 30 μm, and an array pitch 4 in a Y-direction is 60 μm.

The sapphire substrate is an example of a substrate on which optical devices are formed and that is a target of a LIFT method according to the present embodiment. A back surface of the sapphire substrate is ground so as to allow a laser beam to penetrate therethrough, and a front surface of the sapphire substrate on which the LEDs are formed is textured for higher luminance.

The following Table 1 indicates a relationship between a type of a display and a pixel pitch. In a case of a 21-inch display, the pixel pitch is a positive integer multiple of an array pitch of the sapphire substrate. As a result, execution of normal laser lift-off allows for production of a carrier substrate preferable for stamping, and allows for high-speed mounting using stamping.

TABLE 1

| Display type | Pixel pitch |
|---|---|
| 100 inch (4K) | 0.577 mm |
| 100 inch (8K) | 0.288 mm |
| 55 inch (4K) | 0.316 mm |
| 55 inch (8K) | 0.158 mm |
| 21 inch (4K) | 0.120 mm |
| 21 inch (8K) | 0.060 mm |

A description herein is given of a method of fabricating a carrier substrate for a 100-inch display (4K or 8K).

As indicated in Table 1, the pixel pitch of the 100-inch display is 0.577 mm in a case of 4K (3840×2160 pixels) and 0.288 mm in a case of 8K (7680×4320 pixels), and is not a positive integer multiple of 30 μm of the array pitch nor a positive integer multiple of 60 μm of the array pitch. As a target array pitch that becomes an integer, 72.1 μm is to be selected. The pixel pitch is eight times the target array pitch in the case of 4K, and four times the target array pitch in the case of 8K.

Subsequently, a description is given of fabrication of the carrier substrate with the target array pitch using a LIFT apparatus. As the LIFT apparatus, the LIFT apparatus described in Patent Literature 4 is used. The sapphire substrate is adsorbed, as a donor substrate of the LIFT apparatus, to a donor stage with a surface on which the micro LEDs are formed facing downward, and the carrier substrate including an adhesive layer is adsorbed, as a receptor substrate of the LIFT apparatus, to a receptor stage so as to face the sapphire substrate.

If positioning accuracy of a robot that conveys each substrate to a stage is sufficient, the LIFT apparatus moves preliminarily input coordinates of two or more alignment marks to those of a high-magnification camera position, performs image processing to recognize the alignment marks, calculates a shift amount from the center of a camera, feeds the shift amount back to the stage, and thereby performs alignment with high accuracy. If the accuracy of a conveyance system is insufficient, the LIFT apparatus needs to perform alignment using a low-magnification camera or perform coarse adjustment using a positioning sensor.

After the alignment, an interval between the substrates is adjusted by using a Z-axis of a receptor stage. A predetermined value indicating an interval from the micro LED to the adhesive layer is set based on a position of each substrate measured by a height sensor, a thickness of the sapphire substrate, a thickness of the micro LED, and a thickness of the carrier substrate, a thickness of the adhesive layer, and the like. The predetermined value is preferably 10 to 200 μm, more preferably 50 to 150 μm. This is because there is a possibility that the interval being less than 10 μm brings the substrates into contact with each other due to deflection of the substrates, and the interval being more than 200 μm decreases seating positions of the micro LEDs.

As for a damage on elements and accuracy of seating positions, a density of gas present between the donor substrate and the receptor substrate is also important regarding air resistance when the micro LEDs fly. Table 2 shows a list of densities of representative gases.

TABLE 2

| Gas | Density (kg/m³) at 0° C. | Reference |
|---|---|---|
| Air | 1.293 | 1.091 at 40° C. |
| Nitrogen | 1.250 | 1.023 at 50° C. |
| Oxygen | 1.429 | 1.168 at 50° C. |
| Ozone | 2.14 | |
| Argon | 1.784 | 1.519 at 50° C. |
| Helium | 0.1785 | |

In low-density gas such as helium, a flying speed cannot be appropriately decreased, and a damage, such as chipping and cracking, is caused on a device. When a gas density is too high, resistance due to gas is high and the accuracy of the seating positions decreases with slight asymmetry. With the predetermined value of 10 to 200 μm, which is a flying distance, a gas density of 1 to 2 kg/m³ is preferable.

A speed ratio for scanning the stage of the sapphire substrate and the stage of the carrier substrate is a ratio of the array pitch of the above-mentioned sapphire substrate and the target array pitch of the carrier substrate for the 100-inch display. If a stage speed of the sapphire substrate is set at 200 mm/s as a reference, a stage speed of the carrier substrate is to be 480.666667 mm/s, which is 2.403333333 times, in the X-direction and is to be 240.333333 mm/s, which is 1.201666667 times, in the Y-direction.

As a photomask, a chrome mask formed of a 5-inch squire quartz glass substrate on which chrome is vapor-deposited with a thickness of 100 to 200 nm is used. A pattern having apertures corresponding to the array and size of 500 micro LEDs in the X-direction and a pattern having apertures corresponding to the array and size of 200 micro LEDs in the Y-direction are produced.

A mask pattern is described with reference to FIG. 2. A black portion in FIG. 2 represents a chrome surface that blocks light, and white portions represent apertures through which a laser beam penetrates. On a mask surface for a one-fifth optical projection system, the mask pattern has a size five times a field size of a projection surface. Hence, an aperture per LED has a size of 100 μm×200 μm, a pitch of apertures is 150 μm, and a length of an aperture group of 500 apertures is 74.95 mm. In a case where there is no damage on the adhesive layer of the carrier substrate due to laser irradiation, the aperture may be a rectangular aperture having a size of 75000 μm×250 μm or the like.

Alignment between a photomask coordinate system and a stage coordinate system is performed when the mask is replaced. In a case where a process with high accuracy is required, mask alignment is also performed when a pattern is switched within the identical mask. A mask alignment method is different depending on a configuration of an apparatus, and there are a method of observing an alignment mark formed on the mask with a high-magnification camera to perform alignment and a method of observing a mask projection image with a profiler installed on the stage to perform alignment.

In a case where there is a Θ shift with respect to an optical axis of the mask, that is, a Θ shift with respect to a scan axis of the substrate stage, alignment needs to be performed on the mask stage. Regarding a shift within a plane that is perpendicular to the optical axis in an X- or Y-direction, however, alignment may be performed on the mask stage or mask alignment may be performed by setting a correction value on the substrate stage side.

An actual LIFT operation is now described. As the donor substrate, the 4-inch Φ sapphire substrate is used. The receptor substrate is a 6-inch Φ quartz substrate, and includes the adhesive layer having a hardness of 30 and a thickness of 20 μm on its surface. The adhesive layer has the following issues, for example. If the adhesive layer is too hard, there occurs a damage such as cracking on the micro LEDs. If the adhesive layer is too soft, the micro LEDs leap and are not seated, or are embedded in the adhesive layer. Thus, it is preferable that the hardness be 20 to 50 (Japanese Industrial Standards (JIS), type A) and the thickness be 5 μm or more with which the adhesive layer is less susceptible to a type of the receptor substrate and characteristics of a material of the adhesive layer become main characteristics. The hardness is more preferably 25 to 40. The thickness of the adhesive layer is preferably 100 μm or less, more preferably 10 to 50 μm.

The LIFT apparatus first performs LIFT in the Y-direction in FIG. 1. As the photomask, the pattern having apertures corresponding to the array and size of the 500 micro LEDs in the X-direction in FIG. 1 is set. A speed in a constant speed region on the donor stage and a speed in a constant speed region on the receptor stage are set at 200 mm/s and 240.333333 mm/s, respectively.

The irradiation method for the 4-inch Φ substrate is described with reference to FIG. 3. The entire surface is irradiated by execution of scan irradiation by projection of the mask pattern with a length of about 15 mm seven times. A hatched area is an irradiation area, and irradiation is performed only at a position where the micro LEDs are mounted.

Assuming that an irradiation start position (X, Y) of the 4-inch Φ substrate serving as the donor substrate is at (0, −10.0), an irradiation start position of the 6-inch Φ substrate serving as the receptor substrate is at (0, −12.0166667). An acceleration distance is set so that a speed becomes the set constant speed at the start position, and the speed is constant in the entire irradiation area. A trigger is input to a pulse laser with reference to stage coordinates, and irradiation is performed only at coordinates at which the micro LEDs are mounted.

LIFT of GaN-based micro LEDs from the sapphire substrate requires a high energy density of 0.5 to 2 J/cm² because the sapphire substrate is the epitaxial substrate.

Part of array as a result of the LIFT is shown in FIG. 4. The micro LEDs are arrayed in a vertically-long ellipse shape in which an array pitch 5 extends in the Y-direction on the 6-inch Φ substrate.

Subsequently, LIFT in the X-direction is performed. The 6-inch Φ quartz substrate (first carrier substrate 6) removed from the receptor stage is rotated by 90 degrees within the X-Y plane in FIG. 4 and adsorbed as the donor substrate. A blank 6-inch Φ quartz substrate as a second carrier substrate 8 is adsorbed to the receptor substrate.

The pattern of the photomask is switched to the pattern having apertures corresponding to the array and size of the 200 micro LEDs in the Y-direction in FIG. 4. Alignment between each of the donor substrate and the receptor substrate and the photomask is similar to the above-mentioned alignment.

A speed in the constant speed region on the donor stage and a speed in the constant speed region on the receptor stage are set at 200 mm/s and 480.666667 mm/s, respectively. An irradiation method is similar to the above-mentioned irradiation method. The entire surface is irradiated by execution of scan irradiation nine times. Assuming that the irradiation start position (X, Y) of the donor substrate is at (0, −10.0), an irradiation start position of the receptor substrate is at (0, −24.0333333). Execution of scan irradiation similar to the above-mentioned scan irradiation based on coordinates obtained as a result of first LIFT in the Y-direction enables obtaining of a result of LIFT after adjustment of the array pitch in the X- and Y-directions as shown in FIG. 5.

While the description has been given in the order that the adjustment of the array pitch in the Y-direction in FIG. 1 is performed and then the adjustment of the array pitch in the X-direction in FIG. 1 is preformed, the order may be such that the adjustment in the X-direction is performed and then the adjustment in the Y-direction is performed.

While the description has been given of the production method for the carrier substrate for monochromatic micro LEDs, micro LEDs of each of RGB are sequentially subjected to LIFT, and the second carrier substrate on which the RGB micro LEDs are arrayed may be fabricated. If all of the RGB micro LEDs are GaN-based micro LEDs, the first carrier substrate is fabricated for micro LEDs of each of R, G and B in the above-mentioned process, and the second carrier substrate can be produced by LIFT of the micro LEDs of onto the second carrier substrate while shifting R micro LEDs, G micro LEDs, and B micro LEDs from each other. FIG. 6 shows an example of the second carrier substrate on which the RGB micro LEDs are mounted. In a case where the R (red) micro LEDs are GaAs-based micro LEDs, it is necessary to preliminarily transfer the R micro LEDs onto the sapphire substrate or the quartz glass substrate in an orientation in which electrodes are located at the front surface of the LEDs, but it is possible to fabricate the second carrier substrate on which the RGB micro LEDs are arranged in a similar procedure. In this case, the sapphire substrate or the quartz glass substrate is not the epitaxial substrate made of a compound semiconductor, an energy density required at the time of the LIFT may be as low as 0.2 to 1.5 J/cm².

While an embodiment of the present invention has been described in detail above, the present invention may be expressed from different perspectives as described in the following (1) to (25).

(1) A LIFT method of performing LIFT of optical devices on a sapphire substrate serving as a donor substrate onto a carrier substrate serving as a receptor substrate, the method comprising steps of:

acquiring a reference position D and an array pitch D of array of the optical devices formed on the sapphire substrate;

acquiring a reference position R and an array pitch R of array of the optical devices to be transferred onto the carrier substrate by LIFT;

based on the reference position D and the reference position R, causing the sapphire substrate and the carrier substrate to face each other and adjusting either or both of a position of the sapphire substrate and a position of the carrier substrate so that a distance from a surface of each of the optical devices to the carrier substrate becomes a predetermined value;

calculating a scan speed ratio VR between the sapphire substrate and the carrier substrate from the array pitch D and the array pitch R;

emitting laser light toward a plurality of the optical devices aligned in a row on a boundary surface between the sapphire substrate and the optical devices from a back surface side of the sapphire substrate;

aligning relative positions of the sapphire substrate and the carrier substrate within a horizontal plane based on the reference position D and the reference position R, and performing a scan operation on the sapphire substrate and the carrier substrate in the speed ratio VR; and emitting laser light in conjunction with the scan operation to perform LIFT.

(2) The LIFT method according to (1), wherein the array pitch D includes an array pitch DX in an X-direction and an array pitch DY in a Y-direction, wherein the array pitch R includes an array pitch RX in the X-direction and an array pitch RY in the Y-direction, and wherein the speed ratio VR includes a speed ratio VRX in the X-direction and a speed ratio VRY in the Y-direction, the speed ratio VRX being calculated from the array pitches DX and RX and the speed ratio VRY being calculated from the array pitches DY and RY, the method further comprising:

a step in which, after LIFT in the speed ratio VRY, the carrier substrate is rotated by 90 degrees within the horizontal plane in a scan direction to be mounted as the donor substrate, instead of the sapphire substrate, and the LIFT onto a second carrier substrate is performed in the speed ratio VRX.

(3) The LIFT method according to (2), wherein emission of the laser light is reduced projection using a photomask, the photomask has a first opening and a second opening, the first opening corresponding to approximately one optical device in the Y-direction and two or more optical devices at the array pitch DX in the X-direction, and the second opening corresponding to approximately one optical device in the X-direction and two or more optical devices at the array pitch RY in the Y-direction, the method further comprising a step of switching a mask so as to use the first opening in a case of LIFT in the speed ratio VRY and use the second opening in a case of LIFT in the speed ratio VRX.

(4) The LIFT method according to (3), wherein openings in the photomask constitute an opening group that is irradiated to each of the optical devices in a shape substantially corresponding to the optical device.

(5) A LIFT apparatus for performing LIFT of optical devices on a sapphire substrate serving as a donor substrate onto a carrier substrate serving as a receptor substrate, the LIFT apparatus comprising:

a first processing unit configured to acquire a reference position D and an array pitch D of array of the optical devices formed on the sapphire substrate;

a second processing unit configured to acquire a reference position R and an array pitch R of array of the optical devices to be transferred onto the carrier substrate by LIFT;

a stage and a stage controller that are configured to, based on the reference position D and the reference position R, cause the sapphire substrate and the carrier substrate to face each other and adjust either or both of a position of the sapphire substrate and a position of the carrier substrate so that a distance from a surface of each of the optical devices to the carrier substrate becomes a predetermined value;

a third processing unit configured to calculate a scan speed ratio VR between the sapphire substrate and the carrier substrate from the array pitch D and the array pitch R;

a reduced projection optical system configured to emit laser light toward a plurality of the optical devices aligned in a row on a boundary surface between the sapphire substrate and the optical devices from a back surface side of the sapphire substrate;

a stage and a stage controller that are configured to align relative positions of the sapphire substrate and the carrier substrate within a horizontal plane based on the reference position D and the reference position R, and perform a scan operation on the sapphire substrate and the carrier substrate in the speed ratio VR; and a laser apparatus configured to emit laser light in conjunction with the scan operation.

(6) A LIFT method of performing LIFT of micro devices on a sapphire substrate serving as a donor substrate onto a receptor substrate including an adhesive layer, the method comprising steps of:

acquiring three-dimensional sizes of micro devices arrayed on the donor substrate, and a reference position D and an array pitch D of the array;

acquiring a reference position R and an array pitch R of array of the micro devices to be mounted onto the receptor substrate by LIFT;

based on the reference position D and the reference position R, causing the donor substrate and the receptor substrate to face each other, measuring an interval between the donor substrate and the receptor substrate, and adjusting either or both of a position of the donor substrate and a position of the receptor substrate so that a distance from a lower surface of each of the micro devices to the receptor substrate becomes a predetermined value; and aligning relative positions of the donor substrate and the receptor substrate within a horizontal plane, and performing reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 J/cm$^2$, a density of an atmosphere filling the interval between the donor substrate and the receptor substrate is 1 to 2 kg/m$^3$, the adhesive layer has a hardness of 20 to 50 and a thickness of 5 μm or more, and the predetermined value is 10 to 200 μm.

(7) A LIFT method of performing LIFT of optical devices on a donor substrate onto a receptor substrate, the LIFT method comprising steps of:

causing the donor substrate and the receptor substrate to face each other to provide an interval between a surface of each of the optical devices and the receptor substrate; and performing LIFT of adjacent optical devices that are arranged at a predetermined interval on the donor substrate onto a carrier substrate while converting the predetermined interval into an interval that is different from the predetermined interval.

(8) The LIFT method according to (7), wherein the interval to be converted is an interval in an X-direction (a short axis direction of the optical devices).

(9) The LIFT method according to (7), wherein the interval to be converted is an interval in a Y-direction (long axis direction of the optical devices).

(10) The LIFT method according to any one of (7) to (9), wherein the interval is 10 to 200 μm.

(11) The LIFT method according to any one of (7) to (10), wherein the LIFT is performed while performing a scan operation on the donor substrate or the receptor substrate.

(12) The LIFT method according to any one of (7) to (11), wherein the optical devices are laser diodes or photodiodes.

(13) The LIFT method according to any one of (7) to (11), wherein the optical devices are LEDs or micro LEDs.

(14) A manufacturing method for a receptor substrate having transferred optical devices, wherein the optical devices on a donor substrate are to be subjected to LIFT onto the receptor substrate, the method comprising steps of:

causing the donor substrate and the receptor substrate to face each other to provide an interval between a surface of each of the optical devices and the receptor substrate; and performing LIFT of adjacent optical devices that are arranged at a predetermined interval on the donor substrate onto a carrier substrate while converting the predetermined interval into an interval that is different from the predetermined interval.

(15) The manufacturing method for the receptor substrate having transferred optical devices according to (14), wherein the interval to be converted is an interval in an X-direction (a short axis direction of the optical devices).

(16) The manufacturing method for the receptor substrate having transferred optical devices according to (14), wherein the interval to be converted is an interval in a Y-direction (long axis direction of the optical devices).

(17) The manufacturing method for the receptor substrate having transferred optical devices according to any one of (14) to (16), wherein the interval is 10 to 200 μm.

(18) The manufacturing method for the receptor substrate having transferred optical devices according to any one of (14) to (17), wherein the LIFT is performed while performing a scan operation on the donor substrate or the receptor substrate.

(19) The manufacturing method for the receptor substrate having transferred optical devices according to any one of (14) to (18), wherein the optical devices are laser diodes or photodiodes.

(20) The manufacturing method for the receptor substrate having transferred optical devices are transferred according to any one of (14) to (18), wherein the optical devices are LEDs or micro LEDs.

(21) A manufacturing method for a display comprising mounting the optical devices on the receptor substrate that is obtained by the manufacturing method for the receptor substrate according to any one of (14) to (19) and to which the optical devices are transferred.

(22) The manufacturing method for the display according to (21), wherein the mounting is mounting using a stamp method.

(23) A LIFT method of performing LIFT of optical devices on a donor substrate onto a receptor substrate, the method comprising steps of:

acquiring an array pitch D of array of the optical devices formed on the donor substrate;

causing the donor substrate and the receptor substrate to face each other, and adjusting either or both of a position of the donor substrate and a position of the receptor substrate so that a distance from a surface of each of the optical devices to the receptor substrate becomes a predetermined value; and calculating a scan speed ratio VR between the donor substrate and the receptor substrate from the array pitch D and an array pitch R of the optical devices to be transferred onto the receptor substrate by LIFT;

emitting laser light toward a plurality of the optical devices aligned in a row on a boundary surface between the donor substrate and the optical devices from a back surface side of the donor substrate;

performing a scan operation on the donor substrate and the receptor substrate in the speed ratio VR; and emitting laser light in conjunction with the scan operation to perform LIFT.

(24) A LIFT apparatus for performing LIFT of optical devices on a donor substrate onto a receptor substrate, the LIFT apparatus comprising:

a mechanism configured to acquire an array pitch D of array of the optical devices formed on the donor substrate;

a mechanism configured to cause the donor substrate and the receptor substrate to face each other and adjust either or both of a position of the donor substrate and a position of the receptor substrate so that a distance from a surface of each of the optical devices to the receptor substrate becomes a predetermined value; and a mechanism configured to calculate a scan speed ratio VR between the donor substrate and the receptor substrate from the array pitch D and an array pitch R of array of the optical devices to be transferred onto the receptor substrate by LIFT;

a reduced projection optical system configured to emit laser light toward a plurality of the optical devices aligned in a row on a boundary surface between the donor substrate and the optical devices from a back surface side of the donor substrate;

a mechanism configured to perform a scan operation on the donor substrate and the receptor substrate in the speed ratio VR; and a laser apparatus configured to emit laser light in conjunction with the scan operation.

(25) A LIFT method of performing LIFT of micro devices on a donor substrate onto a receptor substrate including an adhesive layer, the method comprising steps of:

causing the donor substrate and the receptor substrate to face each other, and adjusting either or both of a position of the donor substrate and a position of the receptor substrate so that a distance from a lower surface of each of the micro devices to the receptor substrate becomes a predetermined value; and performing reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 J/cm$^2$, a density of an atmosphere filling an interval between the donor substrate and the receptor substrate is 1 to 2 kg/m$^3$, the adhesive layer has a hardness of 20 to 50 and a thickness of 5 μm or more, and the predetermined value is 10 to 200 μm.

The present invention is further expressed from different perspectives as described in the following (U1) to (U15).

(U1) A LIFT system configured to perform LIFT optical devices on a sapphire substrate serving as a donor substrate onto a carrier substrate serving as a receptor substrate, the LIFT system comprising:

a mechanism configured to acquire a reference position D and an array pitch D of array of the optical devices formed on the sapphire substrate;

a mechanism configured to acquire a reference position R and an array pitch R of array of the optical devices to be transferred onto the carrier substrate by LIFT;

a mechanism configured to, based on the reference position D and the reference position R, cause the sapphire substrate and the carrier substrate to face each other and adjust either or both of a position of the sapphire substrate and a position of the carrier substrate so that a distance from a surface of each of the optical devices to the carrier substrate becomes a predetermined value;

a mechanism configured to calculate a scan speed ratio VR between the sapphire substrate and the carrier substrate from the array pitch D and the array pitch R;

a mechanism configured to emit laser light toward a plurality of the optical devices aligned in a row on a boundary surface between the sapphire substrate and the optical devices from a back surface side of the sapphire substrate;

a mechanism configured to align relative positions of the sapphire substrate and the carrier substrate within a horizontal plane based on the reference position D and the reference position R, and perform a scan operation on the sapphire substrate and the carrier substrate in the speed ratio VR; and a mechanism configured to emit laser light in conjunction with the scan operation to perform LIFT.

(U2) The LIFT system according to (U1), wherein the array pitch D includes an array pitch DX in an X-direction and an array pitch DY in a Y-direction, wherein the array pitch R includes an array pitch RX in the X-direction and an array pitch RY in the Y-direction, and wherein the speed ratio VR includes a speed ratio VRX in the X-direction and a speed ratio VRY in the Y-direction, the speed ratio VRX being calculated from the array pitches DX and RX and the speed ratio VRY being calculated from the array pitches DY and RY, the LIFT system further comprising:

a mechanism configured to, after LIFT in the speed ratio VRY, rotate the carrier substrate by 90 degrees within the horizontal plane in a scan direction to mount the carrier substrate as the donor substrate, instead of the sapphire substrate, and to perform LIFT of the optical devices onto a second carrier substrate in the speed ratio VRX.

(U3) The LIFT system according to (U2), wherein emission of the laser light is reduced projection using a photomask, the photomask has a first opening and a second opening, the first opening corresponding to approximately one optical device in the Y-direction and two or more optical devices at the array pitch DX in the X-direction, and the second opening corresponding to approximately one optical device in the X-direction and two or more optical devices at the array pitch RY in the Y-direction, the LIFT system further comprising a mechanism configured to switch a mask so as to use the first opening in a case of LIFT in the speed ratio VRY and use the second opening in a case of LIFT in the speed ratio VRX.

(U4) The LIFT system according to (U3), wherein openings in the photomask constitute an opening group that is irradiated to each of the optical devices in a shape substantially corresponding to the optical device.

(U5) A LIFT apparatus for performing LIFT optical devices on a sapphire substrate serving as a donor substrate onto a carrier substrate serving as a receptor substrate, the LIFT apparatus comprising:

a first processing unit configured to acquire a reference position D and an array pitch D of array of the optical devices formed on the sapphire substrate;

a second processing unit configured to acquire a reference position R and an array pitch R of array of the optical devices to be transferred onto the carrier substrate by LIFT;

a stage and a stage controller that are configured to, based on the reference position D and the reference position R, cause the sapphire substrate and the carrier substrate to face each other and adjust either or both of a position of the sapphire substrate and a position of the carrier substrate so that a distance from a surface of each of the optical devices to the carrier substrate becomes a predetermined value;

a third processing unit configured to calculate a scan speed ratio VR between the sapphire substrate and the carrier substrate from the array pitch D and the array pitch R;

a reduced projection optical system configured to emit laser light toward a plurality of the optical devices aligned in a row on a boundary surface between the sapphire substrate and the optical devices from a back surface side of the sapphire substrate;

a stage and a stage controller that are configured to align relative positions of the sapphire substrate and the carrier substrate within a horizontal plane based on the reference position D and the reference position R, and perform a scan operation on the sapphire substrate and the carrier substrate in the speed ratio VR; and a laser apparatus configured to emit laser light in conjunction with the scan operation.

(U6) A LIFT system configured to perform LIFT of micro devices on a sapphire substrate serving as a donor substrate onto a receptor substrate including an adhesive layer, the LIFT system comprising:

a step of acquiring three-dimensional sizes of micro devices arrayed on the donor substrate, and a reference position D and an array pitch D of the array;

a mechanism configured to acquire a reference position R and an array pitch R of array of the micro devices to be mounted onto the receptor substrate by LIFT;

a mechanism configured to, based on the reference position D and the reference position R, cause the donor substrate and the receptor substrate to face each other, measure an interval between the donor substrate and the receptor substrate, and adjust either or both of a position of the donor substrate and a position of the receptor substrate so that a distance from a lower surface of each of the micro devices to the receptor substrate becomes a predetermined value; and a mechanism configured to align relative positions of the donor substrate and receptor substrate within a horizontal plane, and perform reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 $J/cm^2$, a density of an atmosphere filling the interval between the donor substrate and the receptor substrate is 1 to 2 $kg/m^3$, the adhesive layer has a hardness of 20 to 50 and a thickness of 5 μm or more, and the predetermined value is 10 to 200 μm.

(U7) A LIFT system configured to perform LIFT of optical devices on a donor substrate onto a receptor substrate, the LIFT system comprising a mechanism configured to cause the donor substrate and the receptor substrate to face each other to provide an interval between a surface of each of the optical devices and the receptor substrate, and perform LIFT of adjacent optical devices that are arranged at a predetermined interval on the donor substrate onto a carrier substrate while converting the predetermined interval into an interval that is different from the predetermined interval.

(U8) The LIFT system according to (U7), wherein the interval to be converted is an interval in an X-direction (a short axis direction of the optical devices).

(U9) The LIFT system according to (U7), wherein the interval to be converted is an interval in a Y-direction (long axis direction of the optical devices).

(U10) The LIFT system according to any one of (U7) to (U9), wherein the interval is 10 to 200 μm.

(U11) The LIFT system according to any one of (U7) to (U10), wherein the LIFT is performed while performing a scan operation on the donor substrate or the receptor substrate.

(U12) The LIFT system according to any one of (U7) to (U11), wherein the optical devices are laser diodes or photodiodes.

(U13) The LIFT system according to any one of (U7) to (U11), wherein the optical devices are LEDs or micro LEDs.

(U14) A manufacturing system for a receptor substrate having transferred optical devices, wherein the optical devices on a donor substrate are to be subjected to LIFT onto the receptor substrate, the manufacturing system comprising a mechanism configured to cause the donor substrate and the receptor substrate to face each other to provide an interval between a surface of each of the optical devices and the receptor substrate, and perform LIFT of adjacent optical devices that are arranged at a predetermined interval on the donor substrate onto a carrier substrate while converting the predetermined interval into an interval that is different from the predetermined interval.

(U15) The manufacturing system for the receptor substrate having transferred optical devices according to (U14), wherein the interval to be converted is an interval in an X-direction (a short axis direction of the optical devices).

(U16) The manufacturing system for the receptor substrate having transferred optical devices according to (U14), wherein the interval to be converted is an interval in a Y-direction (long axis direction of the optical devices).

(U17) The manufacturing system for the receptor substrate having transferred optical devices according to any one of (U14) to (U16), wherein the interval is 10 to 200 μm.

(U18) The manufacturing system for the receptor substrate having transferred optical devices according to any one of (U14) to (U17), wherein the LIFT is performed while performing a scan operation on the donor substrate or the receptor substrate.

(U19) The manufacturing system for the receptor substrate having transferred optical devices according to any one of (U14) to (U18), wherein the optical devices are laser diodes or photodiodes.

(U20) The manufacturing system for the receptor substrate having transferred optical devices according to any one of (U14) to (U18), wherein the optical devices are LEDs or micro LEDs.

(U21) A manufacturing system for a display, the manufacturing system comprising a mechanism configured to mount the optical devices on the receptor substrate, which is obtained by the manufacturing system for the receptor substrate having transferred optical devices according to any one of (U14) to (U19), onto another substrate.

(U22) The manufacturing method for the display according to (U21), wherein the mounting is mounting using a stamp method.

(U23) A LIFT system configured to perform LIFT of optical devices on a donor substrate onto a receptor substrate, the LIFT system comprising:

a mechanism configured to acquire an array pitch D of array of the optical devices formed on the donor substrate;

a mechanism configured to cause the donor substrate and the receptor substrate to face each other, and adjust either or both of a position of the donor substrate and a position of the receptor substrate so that a distance from a surface of each of the optical devices to the receptor substrate becomes a predetermined value; and a mechanism configured to calculate a scan speed ratio VR between the donor substrate and the receptor substrate from the array pitch D and an array pitch R of the optical devices to be transferred onto the receptor substrate by LIFT;

a mechanism configured to emit laser light toward a plurality of the optical devices aligned in a row on a boundary surface between the donor substrate and the optical devices from a back surface side of the donor substrate;

a mechanism configured to perform a scan operation on the donor substrate and the receptor substrate in the speed ratio VR; and a mechanism configured to emit laser light in conjunction with the scan operation to perform LIFT.

(U24) A LIFT apparatus in which a donor substrate is installed and that is configured to perform LIFT optical devices on the donor substrate onto a receptor substrate, the LIFT apparatus comprising:

a mechanism configured to acquire an array pitch D of array of the optical devices formed on the donor substrate;

a mechanism configured to cause the donor substrate and the receptor substrate to face each other and adjust either or both of a position of the donor substrate and a position of the receptor substrate so that a distance from a surface of each of the optical devices to the receptor substrate becomes a predetermined value; and a mechanism configured to calculate a scan speed ratio VR between the donor substrate and the receptor substrate from the array pitch D and an array pitch R of array of the optical devices to be transferred onto the receptor substrate by LIFT;

a reduced projection optical system configured to emit laser light toward a plurality of the optical devices aligned in a row on a boundary surface between the donor substrate and the optical devices from a back surface side of the donor substrate;

a mechanism configured to perform a scan operation on the donor substrate and the receptor substrate in the speed ratio VR; and a laser apparatus configured to emit laser light in conjunction with the scan operation.

(U25) A LIFT system configured to perform LIFT micro devices on a donor substrate onto a receptor substrate including an adhesive layer, the LIFT system comprising:

a mechanism configured to cause the donor substrate and the receptor substrate to face each other, and adjust either or both of a position of the donor substrate and a position of the receptor substrate so that a distance from a lower surface of each of the micro devices to the receptor substrate becomes a predetermined value; and a mechanism configured to perform reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 J/cm$^2$, a density of an atmosphere filling an interval between the donor substrate and the receptor substrate is 1 to 2 kg/m$^3$, the adhesive layer has a hardness of 20 to 50 and a thickness of 5 μm or more, and the predetermined value is 10 to 200 μm.

Various kinds of mechanisms may be configured so that different mechanisms have different functions, or one mechanism has a plurality of functions.

INDUSTRIAL APPLICABILITY

The present invention can be utilized for part of a fabrication process for a micro LED display. The present invention can also be utilized for increasing a degree of freedom in arrangement of GaN-based laser diodes in a fabrication process for a vertical-cavity surface-emitting laser (VCSEL), a display projector, and a laser projector. Furthermore, the present invention can be utilized for increasing a degree of freedom in arrangement of GaN-based photodiodes in a fabrication process for a flat panel sensor.

REFERENCE SIGNS LIST

1 Sapphire substrate
2 Micro LED
3 Array pitch in X-axis direction
4 Array pitch in Y-axis direction
5 Array pitch adjusted in Y-axis direction
6 First carrier substrate
7 Array pitch in X-axis direction
8 Second carrier substrate

The invention claimed is:

1. A LIFT method of performing LIFT of optical devices on a sapphire substrate serving as a donor substrate onto a carrier substrate serving as a receptor substrate, the method comprising steps of:

acquiring a reference position D and an array pitch D of array of the optical devices formed on the sapphire substrate;

acquiring an array reference position R and an array pitch R of the optical devices to be moved onto the carrier substrate by LIFT;

based on the reference position D and the reference position R, causing the sapphire substrate and the carrier substrate to face each other and adjusting either or both of a position of the sapphire substrate and a position of the carrier substrate so that a distance from a surface of each of the optical devices to the carrier substrate becomes a predetermined value;

calculating a scan speed ratio VR between the sapphire substrate and the carrier substrate from the array pitch D and the array pitch R;

emitting laser light toward a plurality of the optical devices aligned in a row on a boundary surface between the sapphire substrate and the optical devices from a back surface side of the sapphire substrate; and aligning relative positions of the sapphire substrate and the carrier substrate within a horizontal plane based on the reference position D and the reference position R, and performing a scan operation on the sapphire substrate and the carrier substrate in the speed ratio VR; and emitting laser light in conjunction with the scan operation to perform lifting.

2. The LIFT method according to claim 1, wherein the array pitch D includes an array pitch DX in an X-direction and an array pitch DY in a Y-direction, wherein the array pitch R includes an array pitch RX in the X-direction and an array pitch RY in the Y-direction, and wherein the speed ratio VR includes a speed ratio VRX in the X-direction and a speed ratio VRY in the Y-direction, the speed ratio VRX being calculated from the array pitches DX and RX and the speed ratio VRY being calculated from the array pitches DY and RY, the method further comprising:

a step in which, after LIFT in the speed ratio VRY, the carrier substrate is rotated by 90 degrees within the horizontal plane in a scan direction to be mounted as the donor substrate, instead of the sapphire substrate, and the LIFT onto a second carrier substrate is performed in the speed ratio VRX.

3. The LIFT method according to claim 2, wherein emission of the laser light is reduced projection using a photomask, the photomask has a first opening and a second opening, the first opening corresponding to approximately one optical device in the Y-direction and two or more optical devices at the array pitch DX in the X-direction, and the second opening corresponding to approximately one optical device in the X-direction and two or more optical devices at the array pitch RY in the Y-direction, the method further comprising a step of switching a mask so as to use the first opening in a case of LIFT in the speed ratio VRY and use the second opening in a case of LIFT in the speed ratio VRX.

4. The LIFT method according to claim 3, wherein openings in the photomask constitute an opening group that is irradiated to each of the optical devices in a shape substantially corresponding to the optical device.

5. A LIFT apparatus for performing LIFT of optical devices on a sapphire substrate serving as a donor substrate onto a carrier substrate serving as a receptor substrate, the LIFT apparatus comprising:

a first processing unit configured to acquire a reference position D and an array pitch D of array of the optical devices formed on the sapphire substrate;

a second processing unit configured to acquire a reference position R and an array pitch R of array of the optical devices to be transferred onto the carrier substrate by LIFT;

a stage and a stage controller that are configured to, based on the reference position D and the reference position R, cause the sapphire substrate and the carrier substrate to face each other and adjust either or both of a position of the sapphire substrate and a position of the carrier substrate so that a distance from a surface of each of the optical devices to the carrier substrate becomes a predetermined value;

a third processing unit configured to calculate a scan speed ratio VR between the sapphire substrate and the carrier substrate from the array pitch D and the array pitch R;

a reduced projection optical system configured to emit laser light toward a plurality of the optical devices aligned in a row on a boundary surface between the sapphire substrate and the optical devices from a back surface side of the sapphire substrate;

a stage and a stage controller that are configured to align relative positions of the sapphire substrate and the carrier substrate within a horizontal plane based on the reference position D and the reference position R, and perform a scan operation on the sapphire substrate and the carrier substrate in the speed ratio VR; and a laser apparatus configured to emit laser light in conjunction with the scan operation.

6. A LIFT method of performing LIFT of micro devices on a sapphire substrate serving as a donor substrate onto a receptor substrate including an adhesive layer, the method comprising steps of:

acquiring three-dimensional sizes of micro devices arrayed on the donor substrate, and a reference position D and an array pitch D of the array;

acquiring a reference position R and an array pitch R of array of the micro devices to be mounted onto the receptor substrate by LIFT;

based on the reference position D and the reference position R, causing the donor substrate and the receptor substrate to face each other, measuring an interval between the donor substrate and the receptor substrate, and adjusting either or both of a position of the donor substrate and a position of the receptor substrate so that a distance from a lower surface of each of the micro devices to the receptor substrate becomes a predetermined value; and aligning relative positions of the donor substrate and the receptor substrate within a horizontal plane, and performing reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 $J/cm^2$, a density of an atmosphere filling the interval between the donor substrate and the receptor substrate is 1 to 2 $kg/m^3$, the adhesive layer has a hardness of 20 to 50 and a thickness of 5 μm or more, and the predetermined value is 10 to 200 μm.

7. A LIFT method of performing LIFT of optical devices on a donor substrate onto a receptor substrate, the LIFT method comprising:

causing the donor substrate and the receptor substrate to face each other to provide an interval between a surface of each of the optical devices and the receptor substrate; and performing LIFT of adjacent optical devices that are arranged at a predetermined interval on the donor substrate onto a carrier substrate while converting the predetermined interval into an interval that is different from the predetermined interval.

8. The LIFT method according to claim 7, wherein the interval to be converted is an interval in an X-direction (a short axis direction of the optical devices).

9. The LIFT method according to claim 7, wherein the interval to be converted is an interval in a Y-direction (long axis direction of the optical devices).

10. The LIFT method according to claim 7, wherein the interval is 10 to 200 μm.

11. The LIFT method according to claim 7, wherein the LIFT is performed while performing a scan operation on the donor substrate or the receptor substrate.

12. The LIFT method according to claim 7, wherein the optical devices are laser diodes or photodiodes.

13. The LIFT method according to claim 7, wherein the optical devices are LEDs or micro LEDs.

14. The LIFT method according to claim 7, wherein a KrF excimer laser light is irradiated from a back surface side of the donor substrate to the optical devices.

15. The LIFT method according to claim 7, wherein a pulse laser is irradiated from a back surface side of the donor substrate to the optical devices.

16. The LIFT method according to claim 7, wherein the donor substrate is sapphire substrate.

17. The LIFT method according to claim 16, wherein the optical devices are gallium nitride-based semiconductor light emitting diodes formed on the sapphire substrate which is the donor substrate.

18. The LIFT method according to claim 17, wherein a laser light having an energy density of 0.5 to 2 J/cm2 is irradiated from a back surface side of the donor substrate to the optical devices.

19. The LIFT method according to claim 17, wherein the receptor substrate includes an adhesive layer on a surface of the receptor substrate onto which the optical devices are to be transferred by the LIFT, the LIFT is performed by reduced projection of laser light on the optical devices using a photomask.

20. The LIFT method according to claim 7, wherein the receptor substrate includes an adhesive layer on a surface of the receptor substrate onto which the optical devices are to be transferred by the LIFT, the LIFT is performed by reduced projection of laser light on the optical devices using a photomask.

21. A manufacturing method for a receptor substrate having transferred optical devices, wherein the optical devices on a donor substrate are to be subjected to LIFT onto the receptor substrate, the method comprising:

causing the donor substrate and the receptor substrate to face each other to provide an interval between a surface of each of the optical devices and the receptor substrate; and performing LIFT of adjacent optical devices that are arranged at a predetermined interval on the donor substrate onto a carrier substrate while converting the predetermined interval into an interval that is different from the predetermined interval.

22. The manufacturing method for the receptor substrate having transferred optical devices according to claim 21, wherein the interval to be converted is an interval in an X-direction (a short axis direction of the optical devices).

23. The manufacturing method for the receptor substrate having transferred optical devices according to claim 21, wherein the interval to be converted is an interval in a Y-direction (long axis direction of the optical devices).

24. The manufacturing method for the receptor substrate having transferred optical devices according to claim 21, wherein the interval is 10 to 200 μm.

25. The manufacturing method for the receptor substrate having transferred optical devices according to claim 21, wherein the LIFT is performed while performing a scan operation on the donor substrate or the receptor substrate.

26. The manufacturing method for the receptor substrate having transferred optical devices according to claim 21, wherein the optical devices are laser diodes or photodiodes.

27. The manufacturing method for the receptor substrate having transferred optical devices are transferred according to claim 21, wherein the optical devices are LEDs or micro LEDs.

28. A manufacturing method for a display, the method comprising mounting the optical devices on the receptor substrate, which is obtained by the manufacturing method for the receptor substrate having transferred optical devices according to claim 21, onto another substrate.

29. The manufacturing method for the display according to claim 28, wherein the mounting is performed by using a stamp method.

30. The manufacturing method for the receptor substrate having transferred optical devices according to claim 21, wherein a KrF excimer laser light is irradiated from a back surface side of the donor substrate to the optical devices.

31. The manufacturing method for the receptor substrate having transferred optical devices according to claim 21, wherein a pulse laser is irradiated from a back surface side of the donor substrate to the optical devices.

32. The manufacturing method for the receptor substrate having transferred optical devices according to claim 21, wherein the donor substrate is sapphire substrate.

33. The manufacturing method for the receptor substrate having transferred optical devices according to claim 32, wherein the optical devices are gallium nitride-based semiconductor light emitting diodes formed on the sapphire substrate which is the donor substrate.

34. The manufacturing method for the receptor substrate having transferred optical devices according to claim 33, wherein a laser light having an energy density of 0.5 to 2 $J/cm^2$ is irradiated from a back surface side of the donor substrate to the optical devices.

35. The manufacturing method for the receptor substrate having transferred optical devices according to claim 34, wherein the receptor substrate includes an adhesive layer on a surface of the receptor substrate onto which the optical devices are to be transferred by the LIFT, the LIFT is performed by reduced projection of laser light on the optical devices using a photomask.

36. The manufacturing method for the receptor substrate having transferred optical devices according to claim 21, wherein the receptor substrate includes an adhesive layer on a surface of the receptor substrate onto which the optical devices are to be transferred by the LIFT, the LIFT is performed by reduced projection of laser light on the optical devices using a photomask.

37. A LIFT method of performing LIFT of optical devices on a donor substrate onto a receptor substrate, the method comprising steps of:

acquiring an array pitch D of array of the optical devices formed on the donor substrate;

causing the donor substrate and the receptor substrate to face each other, and adjusting either or both of a position of the donor substrate and a position of the receptor substrate so that a distance from a surface of each of the optical devices to the receptor substrate becomes a predetermined value; and calculating a scan speed ratio VR between the donor substrate and the receptor substrate from the array pitch D and an array pitch R of the optical devices to be transferred onto the receptor substrate by LIFT;

emitting laser light toward a plurality of the optical devices aligned in a row on a boundary surface between the donor substrate and the optical devices from a back surface side of the donor substrate;

performing a scan operation on the donor substrate and the receptor substrate in the speed ratio VR; and emitting laser light in conjunction with the scan operation to perform LIFT.

38. The LIFT method according to claim 37, wherein the donor substrate is sapphire substrate, the optical devices are gallium nitride-based semiconductor light emitting diodes formed on the sapphire substrate which is the donor substrate, the receptor substrate includes an adhesive layer on a surface of the receptor substrate onto which the optical devices are to be transferred by the LIFT, and emission of the laser light is a reduced projection using a photomask.

39. A LIFT apparatus for performing LIFT of optical devices on a donor substrate onto a receptor substrate, the LIFT apparatus comprising:

a mechanism configured to acquire an array pitch D of array of the optical devices formed on the donor substrate;

a mechanism configured to cause the donor substrate and the receptor substrate to face each other and adjust either or both of a position of the donor substrate and a position of the receptor substrate so that a distance from a surface of each of the optical devices to the receptor substrate becomes a predetermined value; and a mechanism configured to calculate a scan speed ratio VR between the donor substrate and the receptor substrate from the array pitch D and an array pitch R of array of the optical devices to be transferred onto the receptor substrate by LIFT;

a reduced projection optical system configured to emit laser light toward a plurality of the optical devices aligned in a row on a boundary surface between the donor substrate and the optical devices from a back surface side of the donor substrate;

a mechanism configured to perform a scan operation on the donor substrate and the receptor substrate in the speed ratio VR; and a laser apparatus configured to emit laser light in conjunction with the scan operation.

40. A LIFT method of performing LIFT of micro devices on a donor substrate onto a receptor substrate including an adhesive layer, the method comprising steps of:

causing the donor substrate and the receptor substrate to face each other, and adjusting either or both of a position of the donor substrate and a position of the receptor substrate so that a distance from a lower surface of each of the micro devices to the receptor substrate becomes a predetermined value; and performing reduced projection on a boundary surface between the donor substrate and the micro devices with laser light from a back surface side of the donor substrate, wherein the laser light with which the reduced projection is performed is KrF excimer laser light, and a density of irradiation energy thereof is 0.5 to 2 J/cm$^2$, a density of an atmosphere filling an interval between the donor substrate and the receptor substrate is 1 to 2 kg/m$^3$, the adhesive layer has a hardness of 20 to 50 and a thickness of 5 μm or more, and the predetermined value is 10 to 200 μm.

41. The LIFT method according to claim 40, wherein the donor substrate is sapphire substrate, and the optical devices are gallium nitride-based semiconductor light emitting diodes formed on the sapphire substrate which is the donor substrate.

42. The LIFT method according to claim 41, wherein the reduced projection is a reduced projection using a photomask.

43. The LIFT method according to claim 40, wherein the reduced projection is a reduced projection using a photomask.

* * * * *